United States Patent [19]

Phanse et al.

[11] Patent Number: 6,084,466
[45] Date of Patent: Jul. 4, 2000

[54] VARIABLE GAIN CURRENT SUMMING CIRCUIT WITH MUTUALLY INDEPENDENT GAIN AND BIASING

[75] Inventors: Abhijit Phanse, Santa Clara; Wong Hee, San Jose, both of Calif.

[73] Assignee: National Semiconductor Corporation, Santa Clara, Calif.

[21] Appl. No.: 09/176,783

[22] Filed: Oct. 22, 1998

[51] Int. Cl.[7] .................................................. G06G 7/12
[52] U.S. Cl. .......................... 327/560; 327/562; 327/563; 330/254
[58] Field of Search ................................... 327/560, 561, 327/562, 563; 330/261, 273, 254

[56] References Cited

U.S. PATENT DOCUMENTS

| 4,820,997 | 4/1989 | Sano et al. | 330/252 |
| 5,057,787 | 10/1991 | Arai et al. | 330/254 |
| 5,847,604 | 12/1998 | Dekker | 330/149 |

Primary Examiner—Timothy P. Callahan
Assistant Examiner—An T. Luu
Attorney, Agent, or Firm—Limbach & Limbach L.L.P.

[57] ABSTRACT

A mixing circuit for combining biasing and signals using a selectively variable signal gain which is independent of the biasing and using biasing which is independent of the selectively variable signal gain. A Gilbert cell is used to multiply a differential control voltage, which represents a normalized signal gain factor, with input currents which include biasing components and input signal components. The resultant output current includes a bias component which is independent of the differential control voltage and a signal component which is independent of the input current biasing components. The gain factor has a value between zero and unity which varies in relation to the differential input control voltage.

20 Claims, 5 Drawing Sheets

VARIABLE GAIN CURRENT SUMMING CIRCUIT WITH MUTUALLY INDEPENDENT GAIN AND BIASING

BACKGROUND OF THE INVENTION

1. Field of the Invention

The present invention relates to adaptive signal equalizers for adaptively equalizing high data rate signals received via long lengths of cable, and in particular, to gain controllers for controlling the signal gain of such adaptive signal equalizers.

2. Description of the Related Art

As part of the process of recovering data which has been transmitted over a long length of cable at a high data rate, equalization of the received data signal is required in order to compensate for the loss and phase dispersion characteristics of the cable. For example, referring to FIG. 1, the signal losses associated with a cable increase with frequency, and such signal losses become greater as the cable length is increased from a virtually zero length $L_0$ to greater cable lengths $L_1, L_2, L_3, \ldots$. Therefore, higher order frequency components of the data signal become increasingly attenuated as compared to the lower order frequency components. Accordingly, the degree of signal equalization required increases with frequency as well as cable length.

Further, in those applications where the transmission cable lengths may vary, such equalization must be adaptive by being able to adapt to variations in the transfer function of the cable due to variations in the cable length.

Referring to FIG. 2, a conventional adaptive equalizer 20 includes a unity-gain buffer 22, a high-pass filter 24, a mixer 26 and a signal summation stage 28, interconnected as shown. The input signal $V_i$ is processed by both the unity-gain buffer stage 22 and filtered by the high-pass filter 24. The high-pass filtered signal 25 is mixed with a gain control signal a in the mixer 26. The unity-gain buffered signal 23 and gain-controlled, high-pass filtered signal 27 are summed together in the summation circuit 28 to produce the final output signal $V_O$.

Referring to FIG. 3, it can be seen that by varying the value of the control signal $\alpha$, the overall gain of the high-pass filter profile can be adjusted, thereby providing for adaptive equalization of the output signal $V_O$.

While this conventional technique performs reasonably well, a number of disadvantages exist, particularly when more precise equalization control is desired. For example, depending upon a number of operating parameters of the equalization circuit 20, such as variations in processing during manufacturing and variations in operating voltages and temperatures, the gain factor $\alpha$ may affect the DC biasing of portions of the circuit 20. Further, the output signal $V_O$ may be affected by variations in the DC bias components within the circuit 20. Accordingly, it would be desirable to have a gain-controlled adaptive equalizer in which the output signal is independent of DC bias conditions and in which DC bias conditions are independent of the gain control input.

SUMMARY OF THE INVENTION

A gain controller for an adaptive equalizer in accordance with the present invention provides an output signal which is independent of DC bias conditions and maintains DC bias conditions which are independent of the gain control input. Such a gain controller includes a circuit for combining biasing and signals with a selectively variable signal gain which is independent of such biasing and with biasing which is independent of such selectively variable signal gain.

In accordance with one embodiment of the present invention, a circuit for combining biasing and signals with a selectively variable signal gain which is independent of the biasing and with biasing which is independent of the selectively variable signal gain includes differential amplifier circuits and circuit nodes. A first differential amplifier circuit is configured to receive and multiply a first single-ended input current and a differential input control voltage and in accordance therewith provide a first differential output current. The first single-ended input current includes a bias component and a signal component, the differential input control voltage includes noninverse and inverse components, and the first differential output current includes noninverse and inverse components. A second differential amplifier circuit is configured to receive and multiply a second single-ended input current and the differential input control voltage and in accordance therewith provide a second differential output current. The second single-ended input current is substantially equal to the first single-ended input current bias component, and the second differential output current includes noninverse and inverse components. A first node, coupled to the first and second differential amplifier circuits, is configured to receive and combine a third single-ended input current, the first differential output current inverse component and the second differential output current noninverse component and in accordance therewith provide a first single-ended output current. The third single-ended input current includes a bias component and a signal component, and the first single-ended output current includes a bias component and a signal component. The first single-ended output current bias component is substantially equal to a sum of the second single-ended input current and the third single-ended input current bias component and is substantially independent of the differential input control voltage. The first single-ended output current signal component is substantially equal to a sum of the third single-ended input current signal component and a product of the first single-ended input current signal component and a gain factor and is substantially independent of the first and third single-ended input current bias components and the second single-ended input current. The gain factor has a value between zero and unity which varies in relation to the differential input control voltage. A second node, coupled to the first and second differential amplifier circuits, is configured to receive and combine the first differential output current noninverse component and the second differential output current inverse component and in accordance therewith provide a second single-ended output current. The second single-ended output current includes a bias component and a signal component. The second single-ended output current bias component is substantially equal to the first single-ended input current bias component and is substantially independent of the differential input control voltage. The second single-ended output current signal component is substantially equal to a product of the first single-ended input current signal component and a difference between unity and the gain factor and is substantially independent of the first and third single-ended input current bias components and the second single-ended input current.

In accordance with another embodiment of the present invention, a circuit for mixing biasing and signals with a selectively variable signal gain which is independent of the biasing and with biasing which is independent of the selectively variable signal gain includes transistors and shared terminals. A first transistor includes a first input terminal configured to receive a noninverse component of a differential input control voltage, a second input terminal configured to receive a first portion of a first single-ended input current with a bias component and a signal component, and a first output terminal configured to provide an inverse component of a first differential output current. A second transistor includes a third input terminal configured to receive an inverse component of the differential input control voltage, a fourth input terminal configured to receive a second portion of the first single-ended input current, and a second output terminal configured to provide a noninverse component of the first differential output current. A third transistor includes a fifth input terminal configured to receive the differential input control voltage inverse component, a sixth input terminal configured to receive a first portion of a second single-ended input current, wherein the second single-ended input current is substantially equal to the first single-ended input current bias component, and a third output terminal configured to provide a noninverse component of a second differential output current. A fourth transistor includes a seventh input terminal configured to receive the differential input control voltage noninverse component, an eighth input terminal configured to receive a second portion of the second single-ended input current, and a fourth output terminal configured to provide an inverse component of the second differential output current. A first shared terminal, coupled to the first and third output terminals, is configured to receive and combine a third single-ended input current, the first differential output current inverse component and the second differential output current noninverse component and in accordance therewith provide a first single-ended output current. The third single-ended input current includes a bias component and a signal component, and the first single-ended output current includes a bias component and a signal component. The first single-ended output current bias component is substantially equal to a sum of the second single-ended input current and the third single-ended input current bias component and is substantially independent of the differential input control voltage. The first single-ended output current signal component is substantially equal to a sum of the third single-ended input current signal component and a product of the first single-ended input current signal component and a gain factor and is substantially independent of the first and third single-ended input current bias components and the second single-ended input current. The gain factor has a value between zero and unity which varies in relation to the differential input control voltage. A second shared terminal, coupled to the second and fourth output terminals, is configured to receive and combine the first differential output current noninverse component and the second differential output current inverse component and in accordance therewith provide a second single-ended output current. The second single-ended output current includes a bias component and a signal component. The second single-ended output current bias component is substantially equal to the first single-ended input current bias component and is substantially independent of the differential input control voltage. The second single-ended output current signal component is substantially equal to a product of the first single-ended input current signal component and a difference between unity and the gain factor and is substantially independent of the first and third single-ended input current bias components and the second single-ended input current.

In accordance with still another embodiment of the present invention, a method of combining biasing and signals with a selectively variable signal gain which is independent of the biasing and with biasing which is independent of the selectively variable signal gain includes the steps of:

receiving a first single-ended input current which includes a bias component and a signal component;

receiving a second single-ended input current which is substantially equal to the first single-ended input current bias component;

receiving a third single-ended input current which includes a bias component and a signal component;

receiving a differential input control voltage which includes noninverse and inverse components;

multiplying the first single-ended input current and the differential input control voltage and in accordance therewith generating a first differential output current which includes noninverse and inverse components;

multiplying the second single-ended input current and the differential input control voltage and in accordance therewith generating a second differential output current which includes noninverse and inverse components;

combining the third single-ended input current, the first differential output current inverse component and the second differential output current noninverse component and in accordance therewith generating a first single-ended output current, wherein the first single-ended output current includes a bias component and a signal component, the first single-ended output current bias component is substantially equal to a sum of the second single-ended input current and the third single-ended input current bias component and is substantially independent of the differential input control voltage, the first single-ended output current signal component is substantially equal to a sum of the third single-ended input current signal component and a product of the first single-ended input current signal component and a gain factor and is substantially independent of the first and third single-ended input current bias components and the second single-ended input current, and the gain factor has a value between zero and unity which varies in relation to the differential input control voltage; and combining the first differential output current noninverse component and the second differential output current inverse component and in accordance therewith generating a second single-ended output current, wherein the second single-ended output current includes a bias component and a signal component, the second single-ended output current bias component is substantially equal to the first single-ended input current bias component and is substantially independent of the differential input control voltage, and the second single-ended output current signal component is substantially equal to a product of the first single-ended input current signal component and a difference between unity and the gain factor and is substantially independent of the first and third single-ended input current bias components and the second single-ended input current.

In accordance with yet another embodiment of the present invention, a method of mixing biasing and signals with a selectively variable signal gain which is independent of the biasing and with biasing which is independent of the selectively variable signal gain includes the steps of:

receiving, via a first input terminal of a first transistor, a noninverse component of a differential input control voltage;

receiving, via a second input terminal of the first transistor, a first portion of a first single-ended input current which includes a bias component and a signal component;

outputting, via a first output terminal of the first transistor, an inverse component of a first differential output current;

receiving, via a third input terminal of a second transistor, an inverse component of the differential input control voltage;

receiving, via a fourth input terminal of the second transistor, a second portion of the first single-ended input current;

outputting, via a second output terminal of the second transistor, a noninverse component of the first differential output current;

receiving, via a fifth input terminal of a third transistor, the differential input control voltage inverse component;

receiving, via a sixth input terminal of the third transistor, a first portion of a second single-ended input current, wherein the second single-ended input current is substantially equal to the first single-ended input current bias component;

outputting, via a third output terminal of the third transistor, a noninverse component of a second differential output current;

receiving, via a seventh input terminal of a fourth transistor, the differential input control voltage noninverse component;

receiving, via an eighth input terminal of the fourth transistor, a second portion of the second single-ended input current;

outputting, via a fourth output terminal of the fourth transistor, an inverse component of the second differential output current;

receiving a third single-ended input current which includes a bias component and a signal component;

via a first shared terminal, receiving and combining the third single-ended input current, the first differential output current inverse component and the second differential output current noninverse component and in accordance therewith generating a first single-ended output current, wherein the first single-ended output current includes a bias component and a signal component, the first single-ended output current bias component is substantially equal to a sum of the second single-ended input current and the third single-ended input current bias component and is substantially independent of the differential input control voltage, and the first single-ended output current signal component is substantially equal to a sum of the third single-ended input current signal component and a product of the first single-ended input current signal component and a gain factor and is substantially independent of the first and third single-ended input current bias components and the second single-ended input current, wherein the gain factor has a value between zero and unity which varies in relation to the differential input control voltage; and via a second shared terminal, receiving and combining the first differential output current noninverse component and the second differential output current inverse component and in accordance therewith generating a second single-ended output current, wherein the second single-ended output current includes a bias component and a signal component, the second single-ended output current bias component is substantially equal to the first single-ended input current bias component and is substantially independent of the differential input control voltage, and the second single-ended output current signal component is substantially equal to a product of the first single-ended input current signal component and a difference between unity and the gain factor and is substantially independent of the first and third single-ended input current bias components and the second single-ended input current.

These and other features and advantages of the present invention will be understood upon consideration of the following detailed description of the invention and the accompanying drawings.

DETAILED DESCRIPTION OF THE INVENTION

Figure 1:
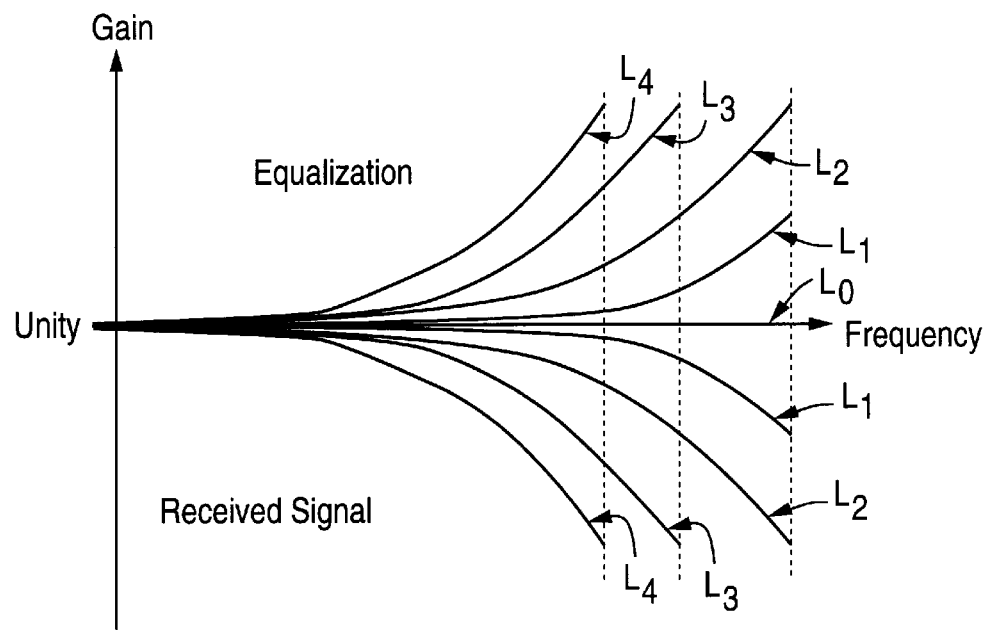
FIG. 1 is a graph of gain versus frequency for illustrating the complementary relationship between signal strength and corresponding equalization provided by a signal equalizer.
Figure 2:
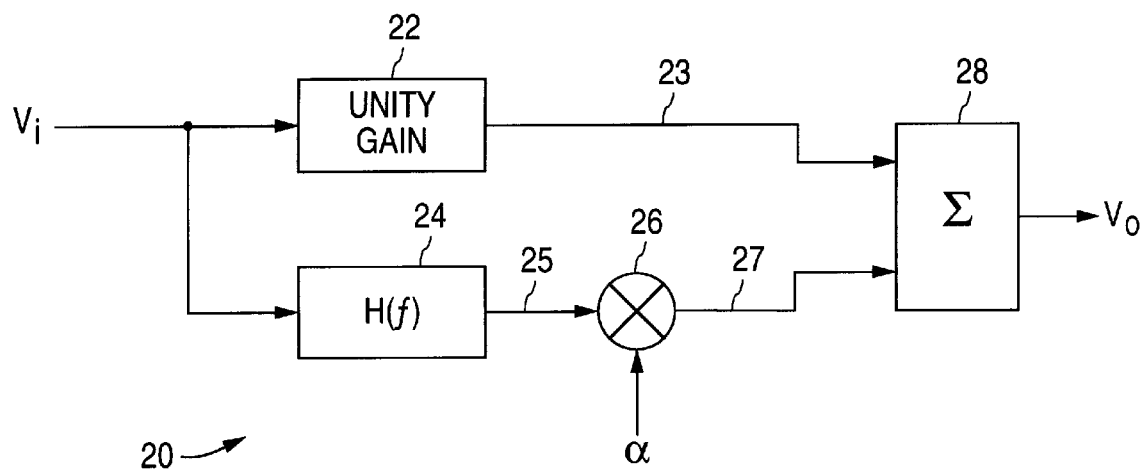
FIG. 2 is a functional block diagram of a conventional adaptive signal equalizer.
Figure 3:
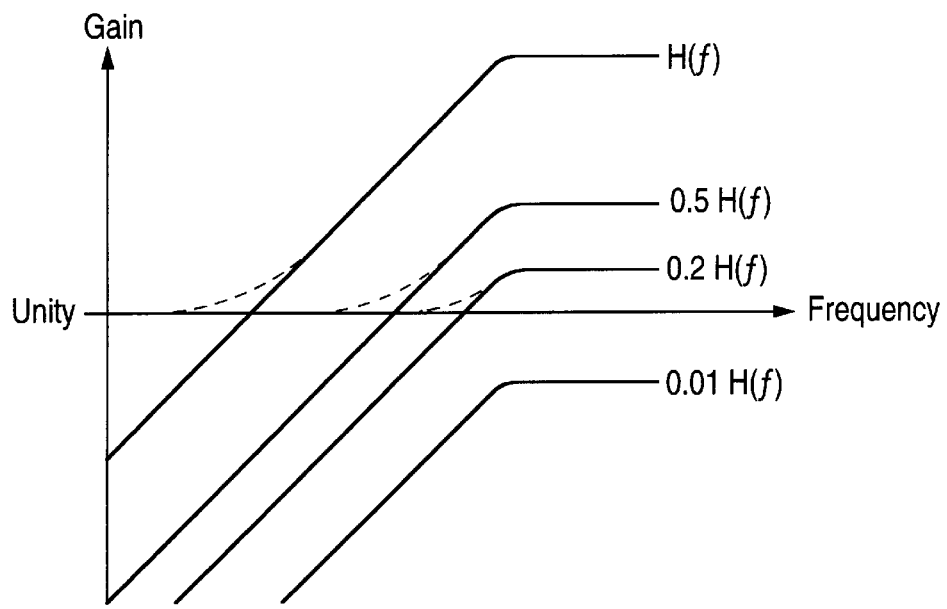
FIG. 3 is a graph of gain versus frequency for the gain-controlled, high-pass filtered portion of the equalizer of FIG. 2.
Figure 4:
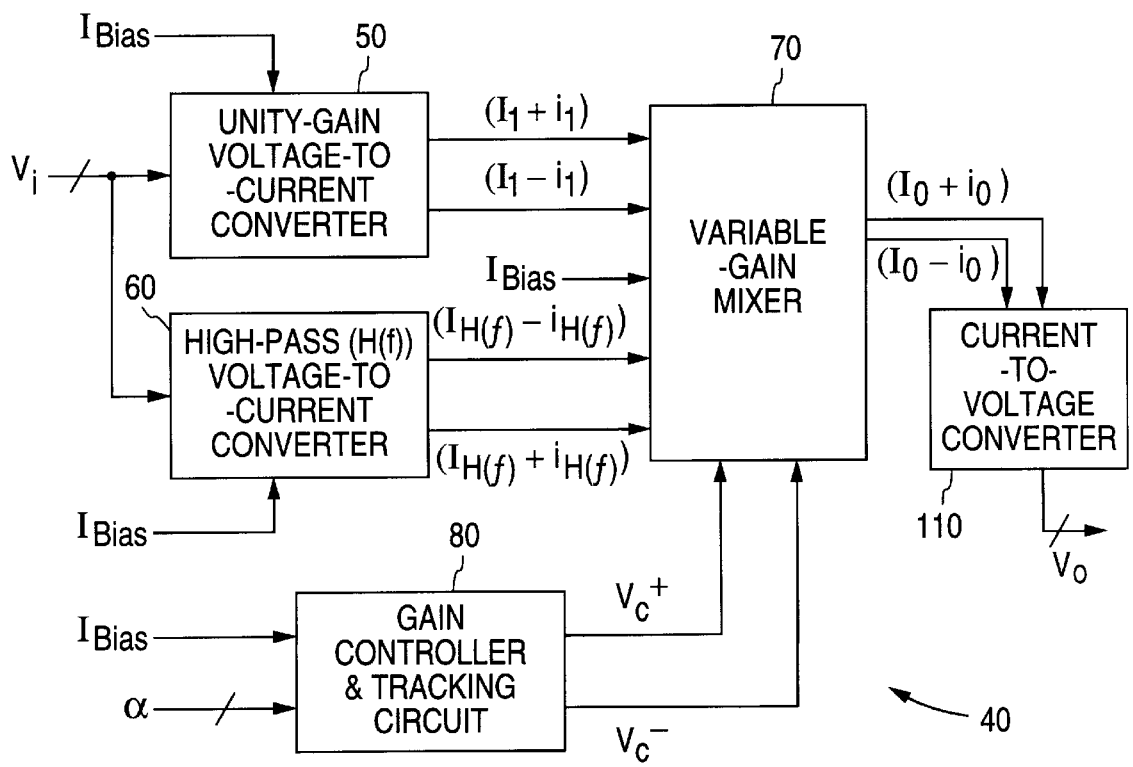
FIG. 4 is a functional block diagram of an adaptive signal equalizer in accordance with one embodiment of the present invention.

Referring to FIG. 4, an adaptive equalizer 40 in accordance with one embodiment of the present invention includes a unity-gain voltage-to-current converter 50, a high-pass voltage-to-current converter 60, a variable-gain mixer 70, a gain controller and tracking circuit 80 and a current-to-voltage converter 110, interconnected substantially as shown. The input signal voltage $V_i$ (which is differential with noninverse $V_i^+$ and inverse $V_i^-$ components) is buffered by the unity-gain voltage-to-current converter 50 which is biased by a bias current $I_{Bias}$ to produce a differential output current signal $(I_1+i_1)/(I_1-i_1)$ which includes a bias component $I_1$ and a signal component $i_1$. (As should be understood, the bias component is that which is due to the DC biasing of the circuit, while the signal component is that which is due to the input signal.) The input signal $V_i$ is also high-pass filtered by the high-pass voltage-to-current converter 60, which is also biased by the DC bias current $I_{Bias}$. This stage 60 produces a differential high-pass filtered signal $(I_{H(f)}+i_{H(f)})/(I_{H(f)}-i_{H(f)})$ which includes a bias component $I_{H(f)}$ and a signal component $i_{H(f)}$. Both of these signals $(I_1+i_1)/(I_1-i_1)$, $(I_{H(f)}+i_{H(f)})/(I_{H(f)}-i_{H(f)})$ are provided to the variable-gain mixer 70.

The gain controller and tracking circuit 80 is also biased by the DC bias current $I_{Bias}$, and receives a digital (e.g., 8-bit) gain control signal α. In accordance with such gain control signal α, the gain controller and tracking circuit 80 generates a differential gain control signal $V_c$, which has a noninverse component $V_c^+$ and an inverse component $V_c^-$. These differential control voltage components $V_c^+$, $V_c^-$ are provided to the variable-gain mixer 70.

The variable-gain mixer 70 is also biased by the DC bias current $I_{Bias}$. In accordance with the control voltage components $V_c^+$, $V_c^-$, which represent the gain factor α, the variable gain mixer 70 mixes its three input current signals: the DC bias current $I_{Bias}$; the unity-gain current signal $(I_1+i_1)$; and the high-pass filtered current signal $(I_{H(f)}+i_{H(f)})/(I_{H(f)}-i_{H(f)})$. Based upon the mixing of these signals, the variable-gain mixer 70 generates an output current $(I_O+i_O)/(I_O-i_O)$ which includes a bias component $I_O$ and a signal component $i_O$.

The output current $(I_O+i_O)/(I_O-i_O)$ from the variable-gain mixer 70 is converted to an output voltage $V_O$ (which is differential with noninverse $V_O^+$ and inverse $V_O^-$ components) by the current-to-voltage converter 110.

Figure 5:
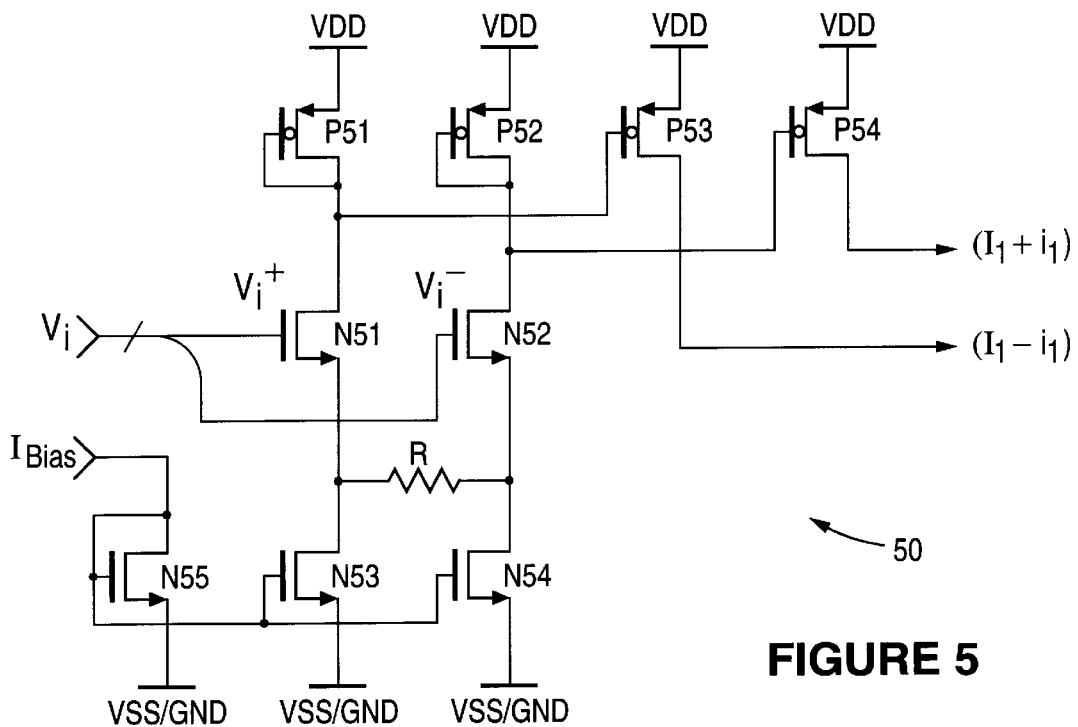
FIG. 5 is a schematic diagram of the unity-gain, voltage-to-current converter stage of the circuit of FIG. 4.

Referring to FIG. 5, the unity-gain voltage-to-current converter 50 includes a differential amplifier combined with two current mirrors biased between the positive VDD and negative VSS/GND terminals of the power supply. The differential amplifier includes transistors P51, P52, N51, N52, N53 and N54 (the prefix "P" designates a P-channel metal oxide semiconductor field effect transistor (P-MOSFET) and the prefix "N" designates an N-channel MOSFET (N-MOSFET)). The bias current mirror includes transistors N55, N53 and N54. The signal current mirror includes transistors P51, P52, P53 and P54.

The DC biasing for the differential amplifier includes driving the bias current mirror with the DC bias current $I_{Bias}$. The gain for the differential amplifier is established by a resistor R connected between the two differential amplifier circuit branches. The inputs to the differential amplifier are driven by the noninverse $V_i^+$ and inverse $V_i^-$ components of the differential input signal voltage $V_i$. The resulting differential currents, i.e., the drain currents of transistors N51 and N52, are replicated by the signal current mirror to produce a differential output current with a noninverse component $(I_1+i_1)$ and an inverse component $(I_1-i_1)$. The bias component $I_1$ is that component of the output current signal which corresponds to the DC biasing for the circuit, i.e., the input DC bias current $I_{Bias}$. The signal component $i_1$ is that component of the output current signal which corresponds to the input signal, i.e., the input signal voltage $V_i$.

Figure 6:
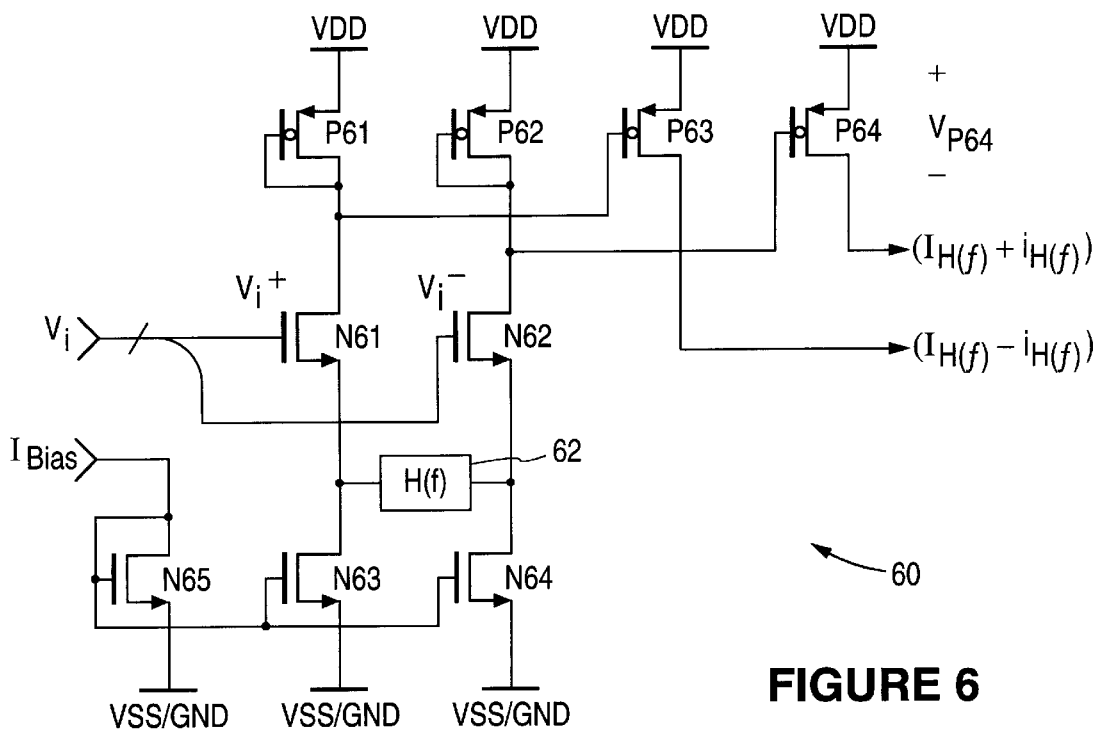
FIG. 6 is a schematic diagram of the high-pass, voltage-to-current converter stage of the circuit of FIG. 4.

Referring to FIG. 6, the high-pass voltage-to-current converter 60 also includes a differential amplifier combined with two current mirror circuits biased between the positive VDD and negative VSS/GND terminals of the power supply. The differential amplifier includes transistors P61, P62, N61, N62, N63 and N64. The bias current mirror includes transistors N65, N63 and N64. The signal current mirror includes transistors P61, P62, P63 and P64.

The DC biasing for the differential amplifier includes driving the input to the bias current mirror with the DC bias current $I_{Bias}$. The high-pass filter transfer function for the differential amplifier is established by connecting a high-pass filter circuit 62 between the two differential amplifier circuit branches. The differential amplifier is driven by the noninverse $V_i^+$ and inverse $V_i^-$ components of the differential input signal voltage $V_i$. The resulting differential currents, i.e., the drain currents of transistors N61 and N62, are replicated by the signal current mirror to provide a differential output current with a noninverse component $(I_{H(f)}+i_{H(f)})$ and an inverse component $(I_{H(f)}-i_{H(f)})$. The bias component $I_{H(f)}$ and signal component $i_{H(f)}$ of the output current signals correspond to the DC bias current $I_{Bias}$ and input signal voltage $V_i$, respectively.

Figure 7:
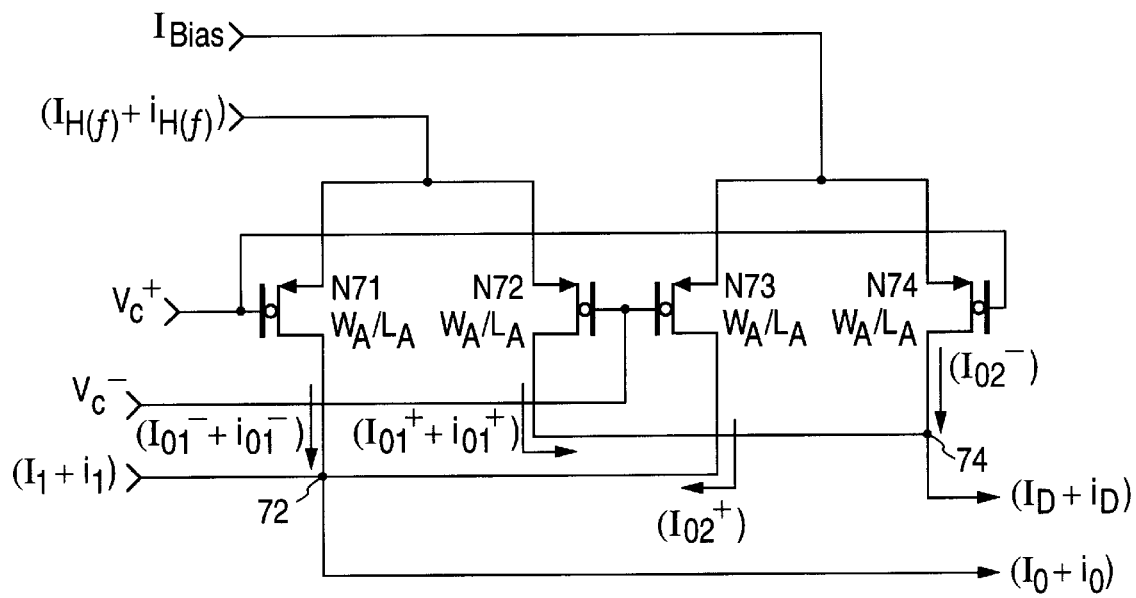
FIG. 7 is a schematic diagram of the "noninverse component" section of the variable-gain mixer stage of the circuit of FIG. 4.

Referring to FIG. 7, the "noninverse component" section 70n of the variable-gain mixer 70 includes two cross-connected differential amplifier circuits: transistors N71 and N72; and transistors N73 and N74. (Only that portion 70n of the variable-gain mixer 70 which is responsible for processing the noninverse components of the differential signals is shown here; however, it should be understood that a similar section is used for processing the inverse components.) All of the differential amplifier transistors N71, N72, N73, N74 have equal channel widths $W_A$ and lengths $L_A$. The first differential amplifier is driven by the noninverse component $(I_{H(f)}+i_{H(f)})$ of the high-pass filtered signal current and the differential control voltage $V_c$ (which represents the gain factor α). This results in a differential output current with an inverse component $(I_{01}^-+i_{01}^-)$ which is provided to an output summing node 72 and a noninverse component $(I_{01}^++i_{01}^+)$ which is provided to a "discard" summing node 74.

The second differential amplifier is driven by the DC bias current $I_{Bias}$ and the differential control voltage $V_c$. This produces a differential output current with a noninverse component $(I_{02}^+)$ which is provided to the output summing node 72 and an inverse component $(I_{02}^-)$ which is provided to the "discard" summing node 74. The output summing node 72 also receives the noninverse unity-gain signal current component $(I_1+i_1)$ and sums it together with the first inverse differential output current component $(I_{01}^{31}+i_{01}^-)$ and second noninverse differential output current component $(I_{02}^+)$ to produce an output current $(I_O+i_O)$. Similarly, the "discard node" 74 sums together the second noninverse differential output current component $(I_{01}^++i_{01}^+)$ and second inverse differential output current component $(I_{02}^-)$ to produce a "discard" current $(I_D+i_D)$.

The output current $(I_O+i_O)$ can be expressed in terms of the DC bias current $I_{Bias}$, the gain factor α (represented by the differential gain control signal $V_c$), the high-pass signal component $(I_{H(f)}+i_{H(f)})$ and the unity-gain signal current component $(I_1+i_1)$ as shown below in Equation 1.

$$I_O+i_O=(I_1+i_1)+\alpha(I_{H(f)}+i_{H(f)})+(1-\alpha)(I_{Bias}) \qquad \text{Eq. 1}$$

This expression can be rewritten to separate the bias and signal components as shown below in Equation 2.

$$I_O+i_O=(i_1+\alpha i_{H(f)})+(I_1+\alpha I_{H(f)}+(1-\alpha)I_{Bias}) \qquad \text{Eq. 2}$$

Accordingly, the signal $i_O$ and bias $I_O$ output current components can be expressed as shown below in Equations 3 and 4, respectively.

$$i_O=i_1+\alpha i_{H(f)} \qquad \text{Eq. 3}$$

$$I_O=I_1+\alpha I_{H(f)}+I_{bias}-\alpha I_{Bias} \qquad \text{Eq. 4}$$

With the bias component $I_{H(f)}$ of the high-pass filtered signal current component ($I_{H(f)}+i_{H(f)}$) equal to the DC bias current $I_{Bias}$ the bias component $I_O$ of the output current ($I_O+i_O$) can be expressed as shown below in Equation 5.

$$I_O=I_1+I_{Bias} \qquad \text{Eq. 5}$$

Similarly, the "discard" current ($I_D+i_D$) can be expressed as shown below in Equation 6.

$$I_D+i_D=(1-\alpha)(I_{H(f)}+i_{H(f)})+\alpha I_{Bias} \qquad \text{Eq. 6}$$

This expression can be rewritten to show its dependence upon the gain control actor $\alpha$ as shown below in Equation 7.

$$I_D+i_D=I_{H(f)}-\alpha(I_{H(f)}-I_{Bias})+(1-\alpha)i_{H(f)} \qquad \text{Eq. 7}$$

Accordingly, the signal $i_D$ and bias $I_D$ current components can be expressed as shown below in Equations 8 and 9, respectively.

$$i_D=(1-\alpha)i_{H(f)} \qquad \text{Eq. 8}$$

$$I_D=I_{H(f)}-\alpha I_{H(f)}+\alpha I_{Bias} \qquad \text{Eq. 9}$$

With the bias component $I_{H(f)}$ of the high-pass filtered signal ($I_{H(f)}+i_{H(f)}$) equal to the DC bias current $I_{Bias}$, as noted above, the "discard" current bias component $I_D$ can be expressed as shown below in Equation 10.

$$I_D=I_{H(f)} \qquad \text{Eq. 10}$$

Figure 8:
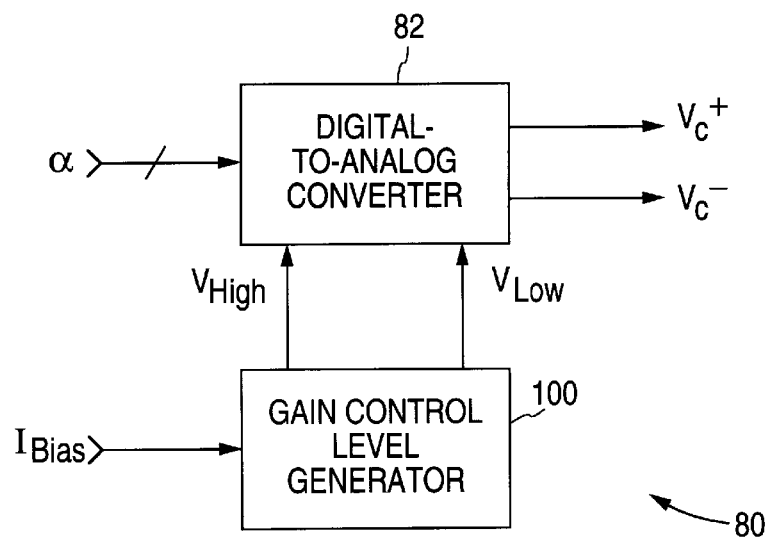
FIG. 8 is a functional block diagram of the gain controller and tracking circuit stage of the circuit of FIG. 4.

Referring to FIG. 8, a gain controller and tracking circuit 80 (FIG. 4) in accordance with one embodiment of the present invention includes a digital-to-analog converter 82 and a gain control level generator 100. (Alternatively, instead of a digital-to-analog converter, a pulse density modulator could be used.) The digital-to-analog converter 82 converts the digital gain control factor a into the differential control voltage components $V_c^+$, $V_c^-$ used by the variable-gain mixer 70. These differential control voltage components $V_c^+$, $V_c^-$ are generated based upon two reference voltages $V_{High}$, $V_{Low}$ provided by the gain control level generator 100 which is biased by the DC bias current $I_{Bias}$.

Figure 9:
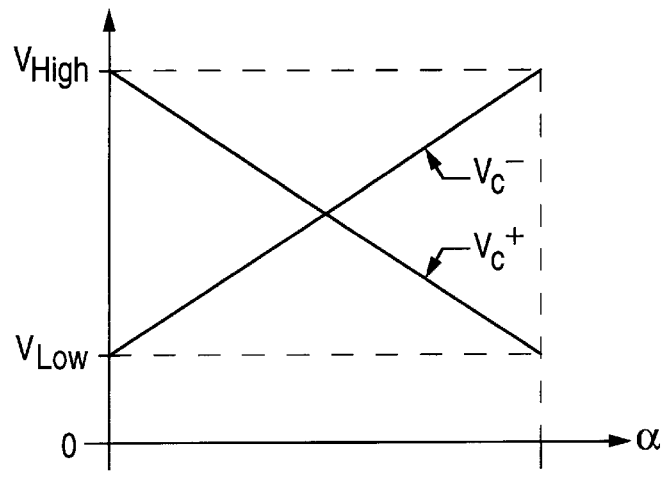
FIG. 9 is a graph of the voltage versus gain factor for the digital-to-analog converter stage of the circuit of FIG. 8.

Referring to FIG. 9, the differential control voltage components $V_c^+$, $V_c^-$ vary in value, in a differential manner, between the low $V_{Low}$ and high $V_{High}$ reference voltage values, in accordance with the value of the gain control factor $\alpha$. For example, when the gain control factor $\alpha$ is equal to zero, the noninverse $V_c^+$ and inverse $V_c^-$ components are equal to the high $V_{High}$ and low $V_{Low}$ reference voltages, respectively. Conversely, when $\alpha$ is at its maximum value, e.g., FF(hex), the noninverse $V_c^+$ and inverse $V_c^-$ control voltage components are equal to the low $V_{Low}$ and high $V_{High}$ reference voltages, respectively.

Figure 10:
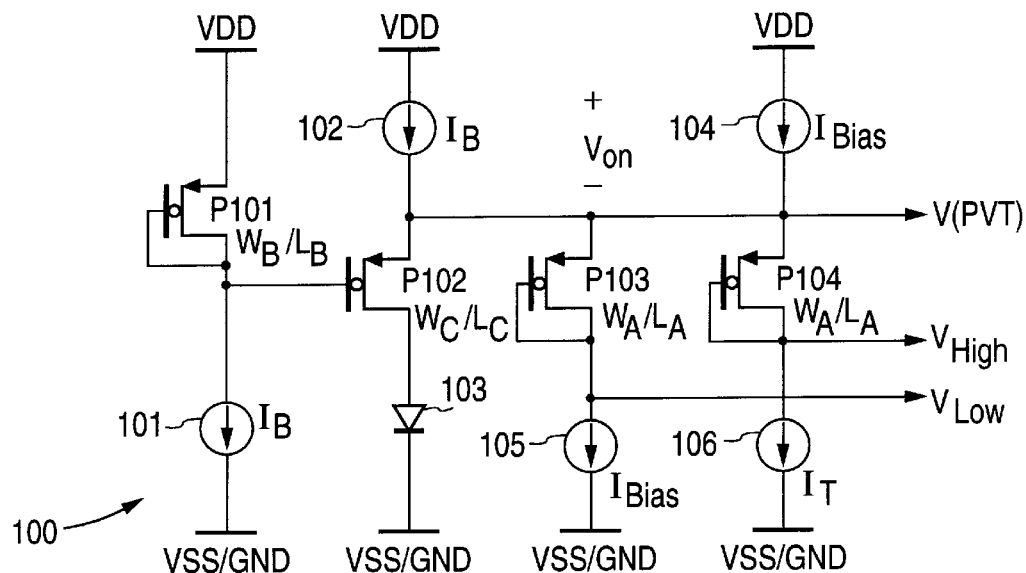
FIG. 10 is a schematic diagram of the gain control level generator stage of the circuit of FIG. 8.

Referring to FIG. 10, a gain control level generator 100 (FIG. 8) in accordance with one embodiment of the present invention includes four transistors P101, P102, P103, P104, a diode 103 and five current sources 101, 102, 104, 105, 106, all interconnected substantially as shown. Transistors P101 (with channel width and length dimensions of $W_B$ and $L_B$, respectively) and P102 (with channel width and length dimensions of $W_C$ and $L_C$, respectively) are biased by a current source circuit 102 and current sink circuit 101, each of which generates a bias current $I_B$. The diode 103 is used to reduce the voltage drop across transistor P102, but is not necessary and, therefore, can be omitted by connecting the drain of transistor P102 directly to VSS/GND. Transistors P101 and P102 have identical threshold voltages $V_{th}$ and respective gate-to-source "on" voltages $V_{on(P101)}$ and $V_{on(P102)}$. Accordingly, the compensated voltage V(PVT) generated at the source of transistor P102 can be expressed as shown below in Equation 11.

$$V(PVT)=VDD-V_{gs(P101)}+V_{gs(P102)} \qquad \text{Eq. 11}$$

This expression can be rewritten by substituting for the gate-to-source voltages $V_{gs(P101)}$ and $V_{gs(P102)}$ of transistors P101 and P102, respectively, as shown below in Equation 12.

$$V(PVT)=VDD-(V_{th}+V_{on(P101)})+(V_{th}+V_{on(P102)}) \qquad \text{Eq. 12}$$

Simplifying further, this expression reduces to that shown below in Equation 13.

$$V(PVT)=VDD-(V_{on(P101)}-V_{on(P102)}) \qquad \text{Eq. 13}$$

Accordingly, the voltage $V_{on}$ across current sources 102 and 104, which is set equal to or greater than the required voltage $V_{P64}$ across the current mirror transistor P64 providing the noninverse component of the high-pass filtered signal ($I_{H(f)}+i_{H(f)}$) in the high-pass voltage-to-current converter 60 (FIG. 6), can be expressed as shown below in Equation 14.

$$V_{on}=V_{on(P101)}-V_{on(P102)} \qquad \text{Eq. 14}$$

This voltage V(PVT) is used, along with current sources 104, 105 and 106 to bias transistors P103 and P104 to generate the high $V_{High}$ and low $V_{Low}$ reference voltages. Diode-connected transistors P103 and P104 have equal channel width $W_A$ and length $L_A$ dimensions, which also equal the corresponding device dimensions of the transistors in the variable-gain mixer 70 (FIG. 7). Current source circuit 104 and sink circuit 105 generate bias currents $I_{Bias}$ equal to the DC bias currents $I_{Bias}$ used to bias the unity-gain voltage-to-current converter 50, the high-pass voltage-to-current converter 60 and the variable-gain mixer 70 (FIG. 4). Current sink circuit 106 generates a trickle current $I_T$ which is very low in value and is used to maintain transistor P104 in a minimal on state.

This circuit 100, because of the above-noted relationships between bias currents $I_{Bias}$ and transistor channel dimensions $W_A$, $L_A$, generates the high $V_{High}$ and low $V_{Low}$ reference voltages such that these voltages $V_{High}$, $V_{Low}$ track variations in the bias current $I_{Bias}$ as well as variations in the operating parameters of the transistors such as threshold voltage and charge carrier mobility. In turn, this allows the output current signal ($I_O+i_O$) to also track variations in the bias current $I_{Bias}$ as well as variations in the operating parameters of the transistors such as threshold voltage and charge carrier mobility (e.g., due to variations in manufacturing processes and operating voltages and temperatures).

Figure 11:
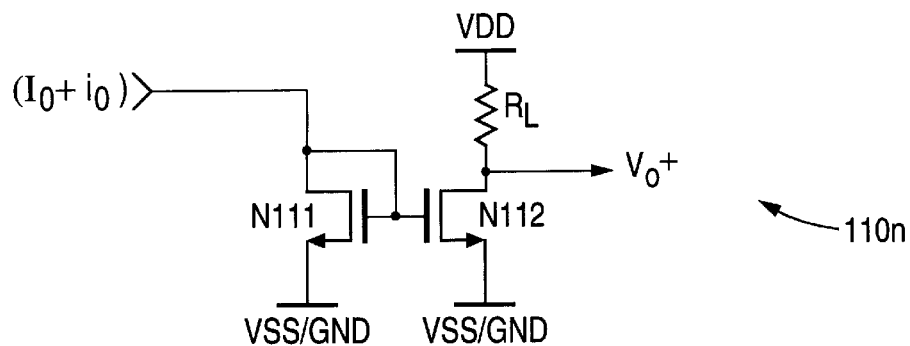
FIG. 11 is a schematic diagram of the "noninverse component" section of the current-to-voltage converter stage of the circuit of FIG. 4.

Referring to FIG. 11, the "noninverse component" section 110n of the output current-to-voltage converter 110 (FIG. 4) can be implemented as follows. (Only that portion 110n of the output current-to-voltage converter 110 which is responsible for processing the noninverse component of the differential output current is shown here; however, it should be understood that a similar section is used for processing the inverse component.) The output current signal ($I_O+i_O$) drives the input to a current mirror formed by transistors N111 and N112. The output current through transistor N112 produces a voltage drop across the load resistor $R_L$, thereby generating the output voltage $V_O^+$.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a circuit for combining biasing and signals with a electively variable signal gain which is independent of said biasing and with biasing which is independent of said selectively variable signal gain, comprising:

a first differential amplifier circuit configured to receive and multiply a first single-ended input current and a differential input control voltage and in accordance therewith provide a first differential output current, wherein said first single-ended input current includes a bias component and a signal component, said differential input control voltage includes noninverse and inverse components, and said first differential output current includes noninverse and inverse components;

a second differential amplifier circuit configured to receive and multiply a second single-ended input current and said differential input control voltage and in accordance therewith provide a second differential output current, wherein said second single-ended input current is substantially equal to said first single-ended input current bias component, and said second differential output current includes noninverse and inverse components;

a first node, coupled to said first and second differential amplifier circuits, configured to receive and combine a third single-ended input current, said first differential output current inverse component and said second differential output current noninverse component and in accordance therewith provide a first single-ended output current, wherein said third single-ended input current includes a bias component and a signal component, said first single-ended output current includes a bias component and a signal component, said first single-ended output current bias component is substantially equal to a sum of said second single-ended input current and said third single-ended input current bias component and is substantially independent of said differential input control voltage, said first single-ended output current signal component is substantially equal to a sum of said third single-ended input current signal component and a product of said first single-ended input current signal component and a gain factor and is substantially independent of said first and third single-ended input current bias components and said second single-ended input current, and said gain factor has a value between zero and unity which varies in relation to said differential input control voltage; and a second node, coupled to said first and second differential amplifier circuits, configured to receive and combine said first differential output current noninverse component and said second differential output current inverse component and in accordance therewith provide a second single-ended output current, wherein said second single-ended output current includes a bias component and a signal component, said second single-ended output current bias component is substantially equal to said first single-ended input current bias component and is substantially independent of said differential input control voltage, and said second single-ended output current signal component is substantially equal to a product of said first single-ended input current signal component and a difference between unity and said gain factor and is substantially independent of said first and third single-ended input current bias components and said second single-ended input current.

2. The apparatus of claim 1, wherein said first and second differential amplifier circuits comprise a Gilbert cell circuit.

3. The apparatus of claim 1, wherein said first and second differential amplifier circuits comprise a signal mixing circuit.

4. The apparatus of claim 1, further comprising:

a variable gain amplifier circuit, coupled to said first differential amplifier circuit, configured to receive and amplify an input signal and in accordance therewith provide said first single-ended input current, wherein said variable gain amplifier circuit has a signal gain which is substantially monotonic over a predetermined range of signal frequencies; and a constant gain amplifier circuit, coupled to said first node, configured to receive and amplify said input signal and in accordance therewith provide said third single-ended input current, wherein said constant gain amplifier circuit has a signal gain which is substantially constant over said predetermined range of signal frequencies.

5. The apparatus of claim 4, wherein:

said variable gain amplifier circuit comprises a filter and voltage-to-current conversion circuit configured to receive an input signal voltage as said input signal and filter and convert said input signal voltage to said first single-ended input current; and said constant gain amplifier circuit comprises another voltage-to-current conversion circuit configured to receive and convert said input signal voltage to said third single-ended input current.

6. The apparatus of claim 5, further comprising a current-to-voltage conversion circuit, coupled to said first node, configured to receive and convert said first single-ended output current to an output signal voltage.

7. An apparatus including a circuit for mixing biasing and signals with a selectively variable signal gain which is independent of said biasing and with biasing which is independent of said selectively variable signal gain, comprising:

a first transistor which includes
a first input terminal configured to receive a noninverse component of a differential input control voltage,
a second input terminal configured to receive a first portion of a first single-ended input current with a bias component and a signal component, and
a first output terminal configured to provide an inverse component of a first differential output current;

a second transistor which includes
a third input terminal configured to receive an inverse component of said differential input control voltage, a fourth input terminal configured to receive a second portion of said first single-ended input current, and a second output terminal configured to provide a noninverse component of said first differential output current;

a third transistor which includes a fifth input terminal configured to receive said differential input control voltage inverse component, a sixth input terminal configured to receive a first portion of a second single-ended input current, wherein said second single-ended input current is substantially equal to said first single-ended input current bias component, and a third output terminal configured to provide a noninverse component of a second differential output current;

a fourth transistor which includes a seventh input terminal configured to receive said differential input control voltage noninverse component, an eighth input terminal configured to receive a second portion of said second single-ended input current, and a fourth output terminal configured to provide an inverse component of said second differential output current;

a first shared terminal, coupled to said first and third output terminals, configured to receive and combine a third single-ended input current, said first differential output current inverse component and said second differential output current noninverse component and in accordance therewith provide a first single-ended output current, wherein said third single-ended input current includes a bias component and a signal component, said first single-ended output current includes a bias component and a signal component, said first single-ended output current bias component is substantially equal to a sum of said second single-ended input current and said third single-ended input current bias component and is substantially independent of said differential input control voltage, said first single-ended output current signal component is substantially equal to a sum of said third single-ended input current signal component and a product of said first single-ended input current signal component and a gain factor and is substantially independent of said first and third single-ended input current bias components and said second single-ended input current, and said gain factor has a value between zero and unity which varies in relation to said differential input control voltage; and a second shared terminal, coupled to said second and fourth output terminals, configured to receive and combine said first differential output current noninverse component and said second differential output current inverse component and in accordance therewith provide a second single-ended output current, wherein said second single-ended output current includes a bias component and a signal component, said second single-ended output current bias component is substantially equal to said first single-ended input current bias component and is substantially independent of said differential input control voltage, and said second single-ended output current signal component is substantially equal to a product of said first single-ended input current signal component and a difference between unity and said gain factor and is substantially independent of said first and third single-ended input current bias components and said second single-ended input current.

8. The apparatus of claim 7, wherein said first, second, third and fourth transistors comprise first, second, third and fourth metal oxide semiconductor field effect transistors.

9. The apparatus of claim 7, wherein said first, second, third and fourth transistors comprise a Gilbert cell circuit.

10. The apparatus of claim 7, further comprising:

a variable gain amplifier circuit, coupled to said second and fourth input terminals, configured to receive and amplify an input signal and in accordance therewith provide said first single-ended input current, wherein said variable gain amplifier circuit has a signal gain which is substantially monotonic over a predetermined range of signal frequencies; and a constant gain amplifier circuit, coupled to said first shared terminal, configured to receive and amplify said input signal and in accordance therewith provide said third single-ended input current, wherein said constant gain amplifier circuit has a signal gain which is substantially constant over said predetermined range of signal frequencies.

11. The apparatus of claim 10, wherein:

said variable gain amplifier circuit comprises a filter and voltage-to-current conversion circuit configured to receive an input signal voltage as said input signal and to filter and convert said input signal voltage to said first single-ended input current; and said constant gain amplifier circuit comprises another voltage-to-current conversion circuit configured to receive and convert said input signal voltage to said third single-ended input current.

12. The apparatus of claim 11, further comprising a current-to-voltage conversion circuit, coupled to said first shared terminal, configured to receive and convert said first single-ended output current to an output signal voltage.

13. A method of combining biasing and signals with a selectively variable signal gain which is independent of said biasing and with biasing which is independent of said selectively variable signal gain, said method comprising the steps of:

receiving a first single-ended input current which includes a bias component and a signal component;

receiving a second single-ended input current which is substantially equal to said first single-ended input current bias component;

receiving a third single-ended input current which includes a bias component and a signal component;

receiving a differential input control voltage which includes noninverse and inverse components;

multiplying said first single-ended input current and said differential input control voltage and in accordance therewith generating a first differential output current which includes noninverse and inverse components;

multiplying said second single-ended input current and said differential input control voltage and in accordance therewith generating a second differential output current which includes noninverse and inverse components;

combining said third single-ended input current, said first differential output current inverse component and said second differential output current noninverse component and in accordance therewith generating a first single-ended output current, wherein
    said first single-ended output current includes a bias component and a signal component,
    said first single-ended output current bias component is substantially equal to a sum of said second single-ended input current and said third single-ended input current bias component and is substantially independent of said differential input control voltage,
    said first single-ended output current signal component is substantially equal to a sum of said third single-ended input current signal component and a product of said first single-ended input current signal component and a gain factor and is substantially independent of said first and third single-ended input current bias components and said second single-ended input current, and
    said gain factor has a value between zero and unity which varies in relation to said differential input control voltage; and
combining said first differential output current noninverse component and said second differential output current inverse component and in accordance therewith generating a second single-ended output current, wherein
    said second single-ended output current includes a bias component and a signal component,
    said second single-ended output current bias component is substantially equal to said first single-ended input current bias component and is substantially independent of said differential input control voltage, and
    said second single-ended output current signal component is substantially equal to a product of said first single-ended input current signal component and a difference between unity and said gain factor and is substantially independent of said first and third single-ended input current bias components and said second single-ended input current.

14. The method of claim 13, further comprising the steps of:
    receiving and amplifying an input signal using a signal gain which is substantially monotonic over a predetermined range of signal frequencies and in accordance therewith generating said first single-ended input current; and
    further amplifying said input signal using a signal gain which is substantially constant over said predetermined range of signal frequencies and in accordance therewith generating said third single-ended input current.

15. The method of claim 14, wherein:
    said step of receiving and amplifying an input signal using a signal gain which is substantially monotonic over a predetermined range of signal frequencies and in accordance therewith generating said first single-ended input current comprises receiving an input signal voltage as said input signal and filtering and converting said input signal voltage to said first single-ended input current; and
    said step of further amplifying said input signal using a signal gain which is substantially constant over said predetermined range of signal frequencies and in accordance therewith generating said third single-ended input current comprises further converting said input signal voltage to said third single-ended input current.

16. The method of claim 15, further comprising the step of converting said first single-ended output current to an output signal voltage.

17. A method of mixing biasing and signals with a selectively variable signal gain which is independent of said biasing and with biasing which is independent of said selectively variable signal gain, said method comprising the steps of:
    receiving, via a first input terminal of a first transistor, a noninverse component of a differential input control voltage;
    receiving, via a second input terminal of said first transistor, a first portion of a first single-ended input current which includes a bias component and a signal component;
    outputting, via a first output terminal of said first transistor, an inverse component of a first differential output current;
    receiving, via a third input terminal of a second transistor, an inverse component of said differential input control voltage;
    receiving, via a fourth input terminal of said second transistor, a second portion of said first single-ended input current;
    outputting, via a second output terminal of said second transistor, a noninverse component of said first differential output current;
    receiving, via a fifth input terminal of a third transistor, said differential input control voltage inverse component;
    receiving, via a sixth input terminal of said third transistor, a first portion of a second single-ended input current, wherein said second single-ended input current is substantially equal to said first single-ended input current bias component;
    outputting, via a third output terminal of said third transistor, a noninverse component of a second differential output current;
    receiving, via a seventh input terminal of a fourth transistor, said differential input control voltage noninverse component;
    receiving, via an eighth input terminal of said fourth transistor, a second portion of said second single-ended input current;
    outputting, via a fourth output terminal of said fourth transistor, an inverse component of said second differential output current;
    receiving a third single-ended input current which includes a bias component and a signal component;
    via a first shared terminal, receiving and combining said third single-ended input current, said first differential output current inverse component and said second differential output current noninverse component and in accordance therewith generating a first single-ended output current, wherein
        said first single-ended output current includes a bias component and a signal component,
        said first single-ended output current bias component is substantially equal to a sum of said second single-ended input current and said third single-ended input current bias component and is substantially independent of said differential input control voltage, and
        said first single-ended output current signal component is substantially equal to a sum of said third single-ended input current signal component and a product of said first single-ended input current signal component and a gain factor and is substantially independent of said first and third single-ended input current bias components and said second single-ended input current, wherein said gain factor has a value between zero and unity which varies in relation to said differential input control voltage; and via a second shared terminal, receiving and combining said first differential output current noninverse component and said second differential output current inverse component and in accordance therewith generating a second single-ended output current, wherein said second single-ended output current includes a bias component and a signal component, said second single-ended output current bias component is substantially equal to said first single-ended input current bias component and is substantially independent of said differential input control voltage, and said second single-ended output current signal component is substantially equal to a product of said first single-ended input current signal component and a difference between unity and said gain factor and is substantially independent of said first and third single-ended input current bias components and said second single-ended input current.

18. The method of claim 17, further comprising the steps of:

receiving and amplifying an input signal using a signal gain which is substantially monotonic over a predetermined range of signal frequencies and in accordance therewith generating said first single-ended input current; and further amplifying said input signal using a signal gain which is substantially constant over said predetermined range of signal frequencies and in accordance therewith generating said third single-ended input current.

19. The method of claim 18, wherein:

said step of receiving and amplifying an input signal using a signal gain which is substantially monotonic over a predetermined range of signal frequencies and in accordance therewith generating said first single-ended input current comprises receiving an input signal voltage as said input signal and filtering and converting said input signal voltage to said first single-ended input current; and said step of further amplifying said input signal using a signal gain which is substantially constant over said predetermined range of signal frequencies and in accordance therewith generating said third single-ended input current comprises further converting said input signal voltage to said third single-ended input current.

20. The method of claim 19, further comprising the step of converting said first single-ended output current to an output signal voltage.

* * * * *

UNITED STATES PATENT AND TRADEMARK OFFICE
CERTIFICATE OF CORRECTION

PATENT NO. : 6,084,466
DATED : July 4, 2000
INVENTOR(S) : Abhijit Phanse and Wong Hee It is certified that error appears in the above-indentified patent and that said Letters Patent is hereby corrected as shown below:

In Col. 11, line 12, delete "electively" and replace with --selectively--.

Signed and Sealed this

Third Day of April, 2001

*Attest:*

NICHOLAS P. GODICI

*Attesting Officer*     *Acting Director of the United States Patent and Trademark Office*